United States Patent
Chaudhari et al.

(10) Patent No.: US 10,199,518 B2
(45) Date of Patent: *Feb. 5, 2019

(54) METHODS OF GROWING HETEROEPITAXIAL SINGLE CRYSTAL OR LARGE GRAINED SEMICONDUCTOR FILMS AND DEVICES THEREON

(71) Applicants: Karin Chaudhari, Briarcliff Manor, NY (US); Ashok Chaudhari, Briarcliff Manor, NY (US); Pia Chaudhari, Briarcliff Manor, NY (US)

(72) Inventors: Praveen Chaudhari, Briarcliff Manor, NY (US); Ashok Chaudhari, Briarcliff Manor, NY (US)

(73) Assignee: Solar-Tectic LLC, Briarcliff Manor, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/457,314

(22) Filed: Mar. 13, 2017

(65) Prior Publication Data
US 2017/0186893 A1  Jun. 29, 2017

Related U.S. Application Data

(63) Continuation-in-part of application No. 14/979,285, filed on Dec. 22, 2015, which is a
(Continued)

(51) Int. Cl.
*C30B 25/02* (2006.01)
*H01L 31/0236* (2006.01)
(Continued)

(52) U.S. Cl.
CPC ........ *H01L 31/02363* (2013.01); *C30B 19/00* (2013.01); *C30B 23/025* (2013.01);
(Continued)

(58) Field of Classification Search
CPC ......... H01L 21/02603; H01L 21/02645; H01L 21/02653; H01L 21/02532; C30B 11/12; C30B 29/06
See application file for complete search history.

(56) References Cited

U.S. PATENT DOCUMENTS 3,983,012 A   9/1976 Cohen
4,534,820 A * 8/1985 Mori ...................... C30B 11/12
                                                         117/58
(Continued)

FOREIGN PATENT DOCUMENTS

DE      102010044014 A1    5/2012

OTHER PUBLICATIONS

McMahon, et al. "Textured (111) Crystalline Silicon Thin Film Growth on Flexible Glass by e-Beam Evaporation", Jun. 2015, pp. 269-273, vol. 158, Materials Letters, Elsevier, US.
(Continued)

*Primary Examiner* — Matthew J Song
(74) *Attorney, Agent, or Firm* — Danielle C. Sullivan; Carter Ledyard & Milburn LLP

(57) ABSTRACT

A method is provided for making smooth crystalline semiconductor thin-films and hole and electron transport films for solar cells and other electronic devices. Such semiconductor films have an average roughness of 3.4 nm thus allowing for effective deposition of additional semiconductor film layers such as perovskites for tandem solar cell structures which require extremely smooth surfaces for high quality device fabrication.

10 Claims, 9 Drawing Sheets

Related U.S. Application Data continuation-in-part of application No. 14/724,066, filed on May 28, 2015, which is a continuation-in-part of application No. 14/224,675, filed on Mar. 25, 2014, now abandoned, which is a continuation of application No. 13/929,085, filed on Jun. 27, 2013, now Pat. No. 9,722,130, which is a continuation of application No. 12/903,750, filed on Oct. 13, 2010, now Pat. No. 8,491,718, which is a continuation-in-part of application No. 12/774,465, filed on May 5, 2010, now Pat. No. 9,054,249, which is a continuation of application No. 12/154,802, filed on May 28, 2008, now abandoned.

(51) Int. Cl.

| | |
|---|---|
| H01L 31/0687 | (2012.01) |
| H01L 31/18 | (2006.01) |
| H01G 9/20 | (2006.01) |
| C30B 23/02 | (2006.01) |
| C30B 29/52 | (2006.01) |
| C30B 19/00 | (2006.01) |
| C30B 25/18 | (2006.01) |
| H01L 21/02 | (2006.01) |

(52) U.S. Cl.
CPC ............ *C30B 25/02* (2013.01); *C30B 25/183* (2013.01); *C30B 29/52* (2013.01); *H01G 9/2009* (2013.01); *H01L 21/0242* (2013.01); *H01L 21/0262* (2013.01); *H01L 21/02422* (2013.01); *H01L 21/02488* (2013.01); *H01L 21/02491* (2013.01); *H01L 21/02532* (2013.01); *H01L 21/02603* (2013.01); *H01L 21/02645* (2013.01); *H01L 21/02653* (2013.01); *H01L 31/0687* (2013.01); *H01L 31/1804* (2013.01); *H01L 31/1836* (2013.01); *H01L 31/1852* (2013.01); *Y02E 10/544* (2013.01); *Y02E 10/547* (2013.01)

(56) References Cited

U.S. PATENT DOCUMENTS

| | | | |
|---|---|---|---|
| 4,717,688 A | | 1/1988 | Jaentsch |
| 5,326,719 A | | 7/1994 | Green et al. |
| 5,523,587 A | | 6/1996 | Kwo |
| 5,544,616 A | | 8/1996 | Ciszek et al. |
| 5,700,333 A | | 12/1997 | Yamazaki et al. |
| 5,897,331 A | * | 4/1999 | Sopori ............... H01L 21/2026 136/258 |
| 6,097,139 A | | 8/2000 | Tuck et al. |
| 6,429,035 B2 | | 8/2002 | Nakagawa et al. |
| 6,500,604 B1 | | 12/2002 | Dimitrakopoulos |
| 6,784,139 B1 | | 8/2004 | Sankar et al. |
| 7,087,113 B2 | | 8/2006 | Goyal |
| 7,129,154 B2 | | 10/2006 | Yi |
| 7,157,737 B2 | | 1/2007 | Voutsas et al. |
| 7,344,961 B2 | | 3/2008 | Romano et al. |
| 7,625,812 B2 | | 12/2009 | Choi et al. |
| 7,662,678 B2 | | 2/2010 | Xianyu et al. |
| 7,906,229 B2 | | 3/2011 | Goyal |
| 7,964,479 B2 | | 6/2011 | Iacopi et al. |
| 8,012,861 B2 | | 9/2011 | Im |
| 8,043,943 B2 | | 10/2011 | Maboudian et al. |
| 8,071,872 B2 | | 12/2011 | Atanackovic |
| 8,106,397 B2 | | 1/2012 | Kwon et al. |
| 8,491,718 B2 | | 7/2013 | Chaudhari |
| 9,054,249 B2 | * | 6/2015 | Chaudhari .......... C03C 17/3618 |
| 2004/0009649 A1 | * | 1/2004 | Kub ................. B82Y 30/00 438/459 |
| 2005/0253220 A1 | | 11/2005 | Lin et al. |
| 2005/0279274 A1 | | 12/2005 | Niu et al. |
| 2006/0008942 A1 | | 1/2006 | Romano et al. |
| 2006/0009003 A1 | | 1/2006 | Romano et al. |
| 2006/0115964 A1 | | 6/2006 | Findikoglu et al. |
| 2006/0208257 A1 | | 9/2006 | Branz et al. |
| 2006/0255481 A1 | | 11/2006 | Pan |
| 2007/0004222 A1 | | 1/2007 | Wei |
| 2007/0044832 A1 | | 3/2007 | Fritzemeier |
| 2007/0096304 A1 | | 5/2007 | Kabir |
| 2007/0286945 A1 | | 12/2007 | Lahnor et al. |
| 2008/0081439 A1 | | 4/2008 | Coffer |
| 2008/0090072 A1 | | 4/2008 | Findikoglu et al. |
| 2008/0217622 A1 | | 9/2008 | Goyal |
| 2009/0183774 A1 | | 7/2009 | Atanackovic |
| 2009/0266411 A1 | | 10/2009 | Habib et al. |
| 2009/0309104 A1 | | 12/2009 | Im |
| 2010/0096618 A1 | | 4/2010 | Iacopi et al. |
| 2010/0184276 A1 | | 7/2010 | Maboudian et al. |
| 2010/0279513 A1 | | 11/2010 | Niu et al. |
| 2011/0030773 A1 | | 2/2011 | Branz et al. |
| 2011/0034339 A1 | | 2/2011 | Goyal |
| 2011/0062446 A1 | | 3/2011 | Goyal |
| 2011/0308615 A1 | | 12/2011 | Teplin et al. |
| 2012/0012166 A1 | | 1/2012 | Atanackovic |
| 2012/0067423 A1 | | 3/2012 | Lochtefeld et al. |
| 2013/0340826 A1 | | 12/2013 | Yan |
| 2014/0261669 A1 | | 9/2014 | Myers et al. |

OTHER PUBLICATIONS

Van Gestel D. et al. "Aluminium-Induced Crystallization for Thin-Film Polycrystalline Solar Cells:Achievements and Perspective", Solar Energy Materials and Solar Cells, 2013, pp. 261-270, vol. 119, Elsevier, US.

Heimburger, R. et al. "Solvent-Induced Growth of Crystalline Silicon on Glass", pp. 000333-000337, Photovoltaic Specialists Conference (PVSC), 2012, IEEE, USA.

Heimburger, R. et al. "Polycrystalline Silicon Films on Glass Grown by Amorphous-Liquid-Crystalline Transition at Temperatures below 330°C.", 2012, pp. 1784-1788, vol. 520, Thin Solid Films, Elsevier, USA.

Ross, "Controlling Nanowire Structures Through Real Time Growth Studies", Reports on Progress in Physics, Oct. 2010, pp. 1-21, vol. 73, IOP Publishing. UK & US.

Chaudhari et al. "Heteroepitaxial Silicon Film Growth at 600 C From an Al—Si Eutectic Melt", Thin Solid Films 518, Mar. 2010, pp. 5368-5371, Elsevier, US.

Fortuna and Li, "Metal-Catalyzed Semiconductor Nanowires: A Review on the Control of Growth Directions", Semiconductor Science and Technology, 2010, pp. 1-16, vol. 25, IOP Publishing, UK.

Badeshia et al,, "Calculation of Crystallographic Texture due to Displacive Transformations", 2008, pp. 342-346, vol. 99, International Journal of Materials Research, Germany.

Ferro, Gabriel et. el., "VLS Growth of SiC Epilayers, HAL archives-ouvertes", Apr. 6, 2007, pp. 1-23, https://hal.archives-ouvertes.fr/hal-00140374, France.

Kodambaka et al., "Germanium Nanowire Growth Below the Eutectic Temperature", Science, May 2007, pp. 729-732, vol. 316, US.

Wang et al. "Epitaxial Growth of Silicon Nanowires Using an Aluminium Catalyst", Nov. 2006, pp. 186-189, vol. 1, Nature Publishing Group, US.

Teplin et al."Low-Temperature Silicon Homoepitaxy by Hot-Wire Chemical Vapor Deposition with a Ta Filament", Journal of Crystal Growth, Science Direct, Jan. 2006, vol. 287, pp. 2414-2418, Elsevier, US.

Kayes et al., "Comparison of the Device Physics Principle of Planar and Radial p-n Junction Nanorod Solar Cells", Journal of Applied Physics 97, 114302, Dec. 2005, pp. 1-11, America Institute of Physics, US.

Teplin et al. "A Proposed Route to Thin Film Crystal Si Using Biaxially Textured Foreign Template Layers", National Renewable Energy Laboratory, Conference Paper, Nov. 2005, pp. 1-4, U.S. Dept. of Energy, US.

(56) References Cited

OTHER PUBLICATIONS

Findikoglu et al., "Well-Oriented Silicon Thin Films with High Carrier Mobility on Polycrystalline Substrates", Advanced Materials, 2005, pp. 1527-1531, Wiley-VCH Verlag etc., Wernheim, DE.
Wenk and Van Houte, "Texture and Anisotropy", Reports on Progress in Physics, 2004, vol. 67, pp. 1367-1428, Institute of Physics Publishing, UK.
Goyal et al., The Rabits Approach:Using Rolling-Assisted Biaxially Textured Substrates for High-Performance YBCO Superconductors, MRS Bulletin, Aug. 2004, pp. 552-561, mrs.org Publications Bulletin, US.
Ferro, et ano.,"Growth by a Vapour-Liquid-Solid Mechanism: A New Approach for Silicon Carbide Epitaxy" New. J. Chem., Jul. 7, 2004, vol. 28, pp. 889-896, The Royal Society of Chemistry and the Centre National de la Recherche Scientifique, UK.
Rath J.K. "Low Temperature Polycrystalline Silicon: A Review on Deposition, Physical Properties and Solar Cell Applications", Solar Energy Materials & Solar Cells, vol. 76, 2003, pp. 431-487, Elsevier, US.
Hofmann et al. "Gold Catalyzed Growth of Slicon Nanowires by Plasma Enhanced Chemical Vapor Deposition", Journal of Applied Physics, Nov. 2003, pp. 6005-6012, vol. 94, No. 9, US.
Nast et al., "Aluminum-Induced Crystallization of Amorphous Slicon on Glass Substrates above and below the Eutectic Temperature", Applied Physics Letters, Nov. 1998, pp. 3214-3216, vol. 73, No. 22, American Institute of Physics, US.
Goyal et al. "Low Cost Single Crystal-Like Substrates for Practical, High Efficiency Solar Cells", AIP Conference,1997, pp. 377-394, U.S.
Lloyd et al. "Crystallographic Textures", Mineralogical Magazine, 1991, pp. 331-345, vol. 55, Mineralogical Society, UK.
Massalski et al. "Binary Alloy Phase Diagrams", 1990, pp. 425-431, vol. 1, 2nd. Ed., The Materials Information Society, US.
Uematsu et al. "Very-Low-Temperature Silicon Epitaxy by Plasma-CVD Using SiH4—PH3—H2 Reactants for Bipolar Devices", 1988, pp. L493-L495, vol. 27, Part 2, No. 4, Japanese Journal of Applied Physics, Japan.
Yue and Gu, "Semiconductor Eutectic Solar Cell", Dec. 1986, pp. 1-126, California University, Los Angeles, School of Engineering and Applied Science, US Department of Commerce, National Technical Information Service.
Hopkins et ano. "Impurity Effects in Silicon for High Efficiency Solar Cells", 1985, pp. 67-79, vol. 75, Journal of Crystal Growth, Elsevier, Holland.
Kass et al., "Liquid Phase Epitaxy of Silicon: Potentialities and Prospects", Max Planck Institute, Stuttgart, DE., Physica, 129B, 1985, pp. 161-165, Elsevier, Holland.
Davis et al. "Impurities in Silicon Solar Cells", 1980, pp. 677-687, vol. Ed-27, IEEE Transactions on Electron Devices, US.
Girault et al., "Liquid Phase Epitaxy of Silicon at Very Low temperatures", Monpellier, FR, Oct. 1976, pp. 169-177, Journal of Crystal Growth 37 (1977), Holland.
Herd et al., "Metal Contact Induced Crystallization in Films of Amorphous Silicon and Germanium", Jan. 1972, pp. 309-327, Journal of Non-Crystalline Solids 7 (1972), US.

* cited by examiner

METHODS OF GROWING HETEROEPITAXIAL SINGLE CRYSTAL OR LARGE GRAINED SEMICONDUCTOR FILMS AND DEVICES THEREON

The present invention is a Continuation-in-Part of U.S. patent application Ser. No. 14/979,285, filed Dec. 22, 2015, which is a Continuation-in-Part of U.S. patent application Ser. No. 14/724,066, filed May 28, 2015, which is a Continuation-in-Part of U.S. patent application Ser. No. 14/224,675 filed Mar. 25, 2014, now abandoned, which is a continuation of U.S. patent application Ser. No. 13/929,085 filed Jun. 27, 2013, now U.S. Pat. No. 9,722,130, which is a continuation of U.S. patent application Ser. No. 12/903,750 filed Oct. 13, 2010, now U.S. Pat. No. 8,491,718, which is a continuation-in-part of U.S. patent application Ser. No. 12/774,465 filed May 5, 2010, now U.S. Pat. No. 9,054,249, which is a continuation of U.S. patent application Ser. No. 12/154,802 filed May 28, 2008, now abandoned, all of which are hereby incorporated by reference in their entirety.

REFERENCES CITED

U.S. Patent Documents
U.S. Pat. No. 4,717,688 January 1987 Jaentsch . . . 148/171
U.S. Pat. No. 5,326,719 July 1994 Green et al. . . . 427/74
U.S. Pat. No. 5,544,616 August 1996 Ciszek et al. . . . 117/60
U.S. Pat. No. 6,429,035 August 2002 Nakagawa et al. . . . 438/57
U.S. Pat. No. 6,784,139 August 2004 Sankar et al. . . . 505/230

OTHER PUBLICATIONS

Kass et al, Liquid Phase Epitaxy of Silicon: Potentialities and Prospects", Physica B, Vol. 129, 161 (1985).
Massalski et al, "Binary Alloy Phase Diagrams", $2^{nd}$ edition, (1990), ASM International.
Findikoglu et al, "Well-oriented Silicon Thin Films with High Carrier Mobility on Polycrystalline Substrates", Adv. Materials, Vol. 17, 1527, (2005).
Teplin et al, "A Proposed Route to Thin Film Crystal Si Using Biaxially Textured Foreign Template Layers" Conference paper NREL/CP-520-38977, November 2005.
Goyal et al., "The RABiTS approach: Using Rolling-assisted Biaxially Textured Substrates for High-performance YBCO Superconductors," MRS Bulletin, Vol. 29, 552, (2004).
Nast et al, "Aluminum Induced Crystallization of Amorphous Silicon on Glass Substrates Above and Below the Eutectic Temperature", Appl. Phys. Lett., Vol 73, 3214, (1998).
Girault et al, "Liquid Phase Epitaxy of Silicon at very low Temperatures", J. Crystal Growth, Vol. 37, 169 (1977).
Kayes et al, "Comparison of the Device Physics Principles of Planar and Radial p-n junction Nanorod Solar Cells", J. Appl. Phys., Vol. 97, 114302, (2005).

FIELD OF THE INVENTION

The present invention is related to producing large grained to single crystal semiconductor films, such as silicon films, for producing articles such as photovoltaic and other electronic devices.

FEDERAL FUNDING

None

BACKGROUND OF THE INVENTION

It is widely known that radiation from the sun striking earth provides enough energy to supply all of mankind's needs for energy for the indefinite future. Such a source of energy can be clean and environmentally benign.

It is also widely known that global warming is associated with the use of fossil fuels, such as coal, oil, and natural gas. It is accepted by the scientific community that global warming can have severe adverse effects around the planet. There are numerous efforts around the world, combined with a sense of urgency, to cut down emissions from the usage of fossil fuels. A dominant factor in favor of the continual use of fossil fuels is their cost per unit of available energy. If, for example, the cost of producing photovoltaic cells can be reduced by a factor of approximately three while maintaining efficiency of conversion, the photovoltaic technology would become cost competitive with fossil fuels.

A major cost component in photovoltaic cells is the cost of the substrate on which the semiconductor film capable of converting sunlight into electricity is placed. The most widely used substrate is single crystal silicon (Si). These substrates developed for the microelectronics industry have been modified for application in photovoltaic technology. If a silicon film could be deposited on an inexpensive substrate, such as glass, and with comparable quality as that found in silicon single crystals used in the microelectronics industry, the cost of photovoltaic technology would drop significantly.

Epitaxial growth of thin films is a very well established process. It has been investigated by hundreds of researchers. Epitaxial deposition provides a very viable way of growing very good quality films. Many single crystal semiconductors and insulator surfaces are used to study the epitaxial growth of metallic films; for example, the growth of silver on silicon, sapphire, or a mica surface. Epitaxial metallic films have also been grown on other metallic films, such as gold on silver. In contrast to metals, semiconductors, such as silicon, are difficult to grow epitaxially. For example, heteroepitaxial films of silicon have been successfully grown only on sapphire but at temperatures that are relatively high for the applications we disclose here, such as the growth of silicon on glass substrates.

In order to take advantage of highly textured large grained films for photovoltaic technology two problems need to be solved: inexpensive growth of high quality films and the availability of an inexpensive substrate on which desirable properties can be achieved. Here, we disclose a method for growing semiconductor films, such as silicon, satisfying the two requirements listed above and suitable for photovoltaic technology and other electronic applications.

The thermodynamic stability and formation temperature of two or more elements is described by a composition versus temperature diagram, called a phase diagram. In this invention we shall make use of phase diagrams. These phase diagrams are available in the scientific literature (Massalski et al). The phase diagram provides information on the behavior of different phases, solid or liquid as a function of temperature and composition. For example, the liquidus in a simple binary eutectic system, such as Au and Si, shows how the relative composition of the liquid and solid, it is in equilibrium with, changes with temperature. It is therefore possible to choose an average composition, different from the eutectic composition, and cool the mixture in such a way as to precipitate out one phase or the other. If the composition is chosen to be richer in silicon than the eutectic composition then on cooling through the liquidus boundary between the single phase liquid and the two phase liquid plus solid, silicon will nucleate and form a solid phase. If on the other hand it is gold rich relative to the eutectic composition the first solid phase to nucleate is gold rather than silicon.

At and below the eutectic temperature the two components, in this case, Au and Si solidify from the liquid phase to phase separate into the two components Au and Si. The interface energy between the two components is generally positive and therefore drives the two components to aggregate into distinct phases with a minimum of surface area between the two rather than a fine mixture of the two. There is, however, the energetics of two other interfaces to consider also: one with the substrate and the other with vacuum or gas. In considering energetics it is not only the chemical interaction of the metal or Si with the substrate that is important but also its crystallographic orientation, for the surface or interface energy depends upon orientation of the grains. Another concern is the difference in lattice match between the nucleating film and the substrate which can lead to strain induced energy that is minimized by either inducing defects or not growing uniformly in thickness across the substrate surface. These factors determine if silicon is likely to deposit on the substrate (heterogeneous nucleation) or nucleate and forms small crystals in the liquid (homogeneous nucleation).

An advantage of using eutectics compositions is that the eutectic temperature is lower than the melting temperature of the constituent elements. For example, the eutectic temperatures of Au, Al, and Ag with Si are 363, 577, and 835 degrees Centigrade (° C.), respectively. In contrast the melting temperatures of the elements are 1064, 660, and 961° C., respectively. The melting temperature of silicon is 1414° C. The eutectics then offer the possibility of nucleating a silicon crystal from the liquid far below the temperature at which pure liquid silicon crystallizes. By a proper choice of the substrate surface exposed to the nucleating silicon, it is possible to nucleate and grow single crystal or large grained silicon films.

We have discussed silicon eutectics using elements such as Au, Ag, and Al. However, it is possible to replace the elements by silicon based compounds. For example, the compound nickel silicide forms a eutectic with Si. There are numerous other examples of silicide compounds forming a eutectic with Si (Massalski et al). An advantage of using a silicide is that frequently the electrical contact of the silicide with silicon has very desirable properties, such as a good ohmic contact or a Schottky barrier. Some silicides are also known to have an epitaxial relationship with silicon. In this case, by appropriately choosing either a silicide rich or silicon rich melt either the silicon can be induced to grow epitaxially on the silicide or the silicide on silicon. A disadvantage in this approach is the eutectic temperature, which is generally high.

Low temperature solutions can also be formed with some elements, For example, gallium (Ga) and Si have a eutectic temperature of less than 30° C., very close to that of the melting point of Ga. There are other elements, such as indium or tin that form low temperature liquid solutions with silicon. Si can be nucleated from these solutions at very low temperatures relative to pure silicon (Girault et al, Kass et al). These temperatures are sufficiently low that it opens up the possibility of using organic materials as substrates on which large grained to single crystal films can be grown.

While this is an advantage, there is also a serious disadvantage; at these low temperatures, the silicon film can contain defects and hence are not very useful as a photovoltaic material. However, these very low temperature deposits can be used to initiate the nucleation of a very thin silicon film, which is subsequently thickened by using higher temperature processes to optimize its photovoltaic properties.

The choice of a particular system (phase diagram) is not only determined by temperature and energetics of the interfaces, but also by the solubility of the second element in Si. It is desirable to have precise control of the doping of Si in order to optimize its semiconductor properties for photovoltaic applications. It is also important to select the composition of the substrate and temperature of processing such that there is minimal or no chemical interaction between the silicon film and the surface of the substrate on which it is being deposited. From the preceding description, we can extract five common points which are relevant to this invention. First, one end of the phase diagram always has the semiconductor we wish to nucleate and use to produce a film, we have used silicon in the preceding examples but it could be germanium (or any other semiconductor material from Group IV) or a compound such as gallium arsenide (or any other semiconductor material from Group III-V) or cadmium selenide (or any other semiconductor material from Group II-VI). Second, the thermodynamically predicted concentration of the second element or phase in the semiconductor is minimal. If there is solubility then it must be a desirable dopant. For example aluminum (Al) in silicon behaves as a p-type dopant and experience in the semiconductor industry has shown that trace amount of Al can be desirable. Third, the liquidus curve has the highest temperature on the semiconductor side. In other words, the melting point of the semiconductor is greater than the liquidus for all compositions in equilibrium with the semiconductor. Fourth, the homogeneous nucleation energy of silicon crystal from the melt is greater than that for heterogeneous nucleation on the substrate. This latter condition promotes heterogeneous nucleation. And, fifth, the temperature for epitaxial growth is low enough to use inexpensive substrates such as glass but high enough to promote a good quality silicon film. For example, a growth temperature above approximately 550 degrees Centigrade (550° C.) is desirable to make a good quality silicon film. The softening temperature of ordinary glasses is around 600° C. The softening temperature of borosilicate glasses is higher. However it is not high enough to use conventional deposition temperature of greater than 750 degrees Centigrade for silicon on insulator, such as a sapphire substrate.

In order to take full advantage of the invention disclosed here the semiconductor material has to be deposited on a substrate material which is inexpensive, and the surface of which enables heterogeneous nucleation and growth. In the following we shall discuss two specific methods for producing substrates suitable for heterogeneous deposition of films for photovoltaic technology. Both of these methods have been described in the scientific literature and we do not claim to invent them. We include them here for completeness.

The use of rolled and textured Ni and Ni-alloy sheets has been proposed as substrate material for superconducting films and, more recently, for films for photovoltaic devices (Findikoglu et al). In order to facilitate the growth of epitaxial superconducting films on such substrates, there have been two approaches described in the scientific literature: in one the sharp rolling texture produced in a rolled and annealed Ni alloy is used as a template on which various epitaxial buffer layers are deposited followed finally by an epitaxial film of a high temperature cuprate superconductors (Goyal et al). In the second approach (Findikoglu et al), the nickel ribbon is used as a substrate for ion beam assisted deposition of a wide variety of highly textured ceramics, for example, magnesium oxide (MgO). The ion beam aligns the growing MgO film, which provides a template for the subsequent deposition of the cuprate superconductor.

The latter approach is not limited to using metal tapes but can be extended to other inexpensive substrates such as glass (Teplin et al). It has been found that texture can also be induced in MgO by depositing the film on a substrate that is inclined to the normal from the oncoming vapor of MgO.

One limitation of the use of glass as a substrate has been its softening temperature, which is generally lower than the conventional processing temperatures required for the growth of large grained or single crystal films of silicon. With the method of depositing silicon films at low temperatures, described in this invention, the use of buffered glass becomes an option for we can deposit highly textured and large grained silicon on MgO at or below the softening temperature of glass. Similarly, researchers have grown crystalline aluminum oxide ($Al_2O_3$) on inexpensive substrates (Findikoglu et al). We shall use MgO and $Al_2O_3$ as illustrative examples. However, it is understood to those skilled in the art that a variety of other materials can also work. Both Findikoglu et al and Goyal et al describe other buffer layers, including conducting ceramic layers, such as TiN.

OBJECT OF THE INVENTION

It is an object of the present invention to provide single crystal or highly textured relatively large grained good quality semiconductor films and, in particular silicon films, for photovoltaic technology or other semiconductor devices, such as field effect transistors used, for example, in displays.

It is yet another object of this invention to provide single crystal or highly textured relatively large grained good quality semiconductor films and, in particular silicon films, at low temperatures. For example, if silicon films are used, the growth temperature is between 450 and 750 degrees Centigrade.

It is yet another object of this invention to provide single crystal or highly textured relatively large grained good quality semiconductor films and, in particular silicon films, on inexpensive substrates, for example, substrates such as glass on which buffer layers such as MgO and/or $Al_2O_3$ have been deposited.

SUMMARY OF THE INVENTION

In accordance with one aspect of the present invention, the forgoing and other objects can be achieved by alloying a semiconductor and, in particular silicon, with elements or compounds that form an eutectic system, and increasing slowly the concentration of the semiconductor, such as silicon, through the liquidus line to reach the two phase region in which the semiconductor, in particular silicon, nucleates out of the melt and on the surface of a substrate.

In accordance with another aspect of the present invention, the forgoing and other objects can be achieved by alloying a semiconductor and, in particular silicon, with elements or compounds that form an eutectic system, and increasing slowly the concentration of the semiconductor, such as silicon, through the liquidus line to reach the two phase region in which the semiconductor, in particular silicon, nucleates on the surface of a substrate to produce a highly textured relatively large grained or single crystalline film.

In accordance with yet another aspect of the present invention, the forgoing and other objects can be achieved by alloying a semiconductor and, in particular silicon, with elements or compounds that form an eutectic system, and increasing slowly the concentration of the semiconductor, such as silicon, through the liquidus line to reach the two phase region in which the semiconductor, in particular silicon, nucleates on the surface of a substrate made of a buffered tape in which texture is produced by mechanical deformation and the buffer layers are epitaxial to the texture of the metal tape. The buffer layer exposed to the melt comprises of compounds, such as $Al_2O_3$ or MgO.

In accordance with yet another aspect of the present invention, the forgoing and other objects can be achieved by alloying a semiconductor and, in particular silicon, with elements or compounds that form an eutectic system, and increasing slowly the concentration of the semiconductor, such as silicon, through the liquidus line to reach the two phase region in which the semiconductor, in particular silicon, nucleates on the surface of a substrate made of a buffered tape, a glass substrate, or any other material suitable for inexpensive manufacture of photovoltaic cells in which strong texture is produced by ion beam assisted deposition. The final layer, which is exposed to the silicon melt, comprises of compounds, such as $Al_2O_3$ or MgO.

In accordance with still another aspect of the present invention, the forgoing and other objects can be achieved by using a solid phase composition comprising a semiconductor and, in particular silicon, with elements or compounds that form an eutectic system, and in which a thin film of the element or compound is deposited first followed by the semiconductor, such as silicon, and depositing at a temperature where the semiconductor atoms diffuse through the element or compound to heterogeneously nucleate on the substrate and propagate this crystallinity to the semiconductor film remaining on top of the element or compound.

The method of manufacture of materials suitable for photovoltaic technologies described in this invention are much less expensive in the conversion of sunlight into electricity than those practiced in the prior art.

This process continues till the eutectic temperature is reached, at which point the liquid solidifies and phase separates into gold and silicon solids.

We have used the phase diagram of the Au—Si eutectic. The Al—Si eutectic is very similar. Here we can heterogeneously nucleate silicon from the Al—Si melt on a single crystal sapphire substrate to form a single crystal heteroepitaxial silicon film.

Figure 2:
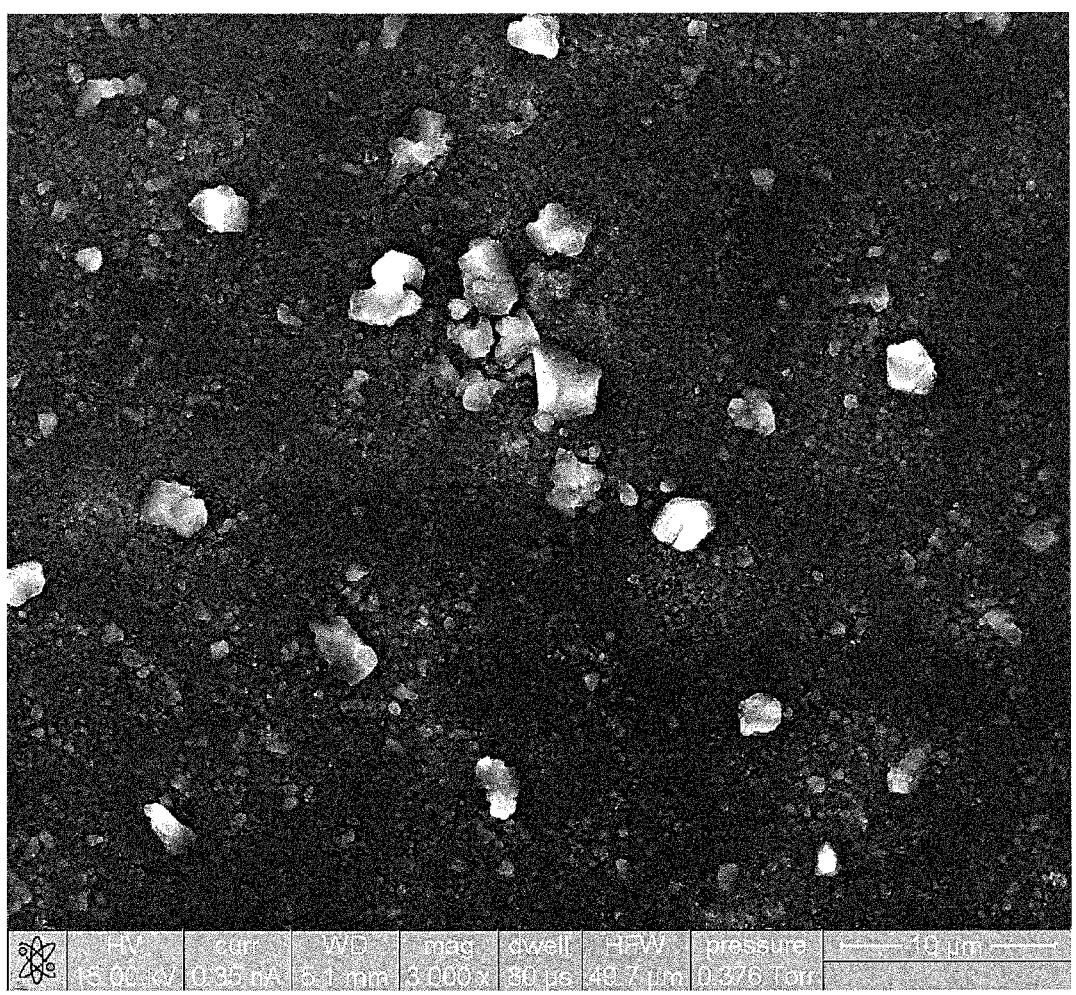

FIG. 2 shows an image of a scanning electron microscopy of silicon thin films deposited on flexible glass for a sample with 40 nm Al/200 nm Si.

Figure 3:
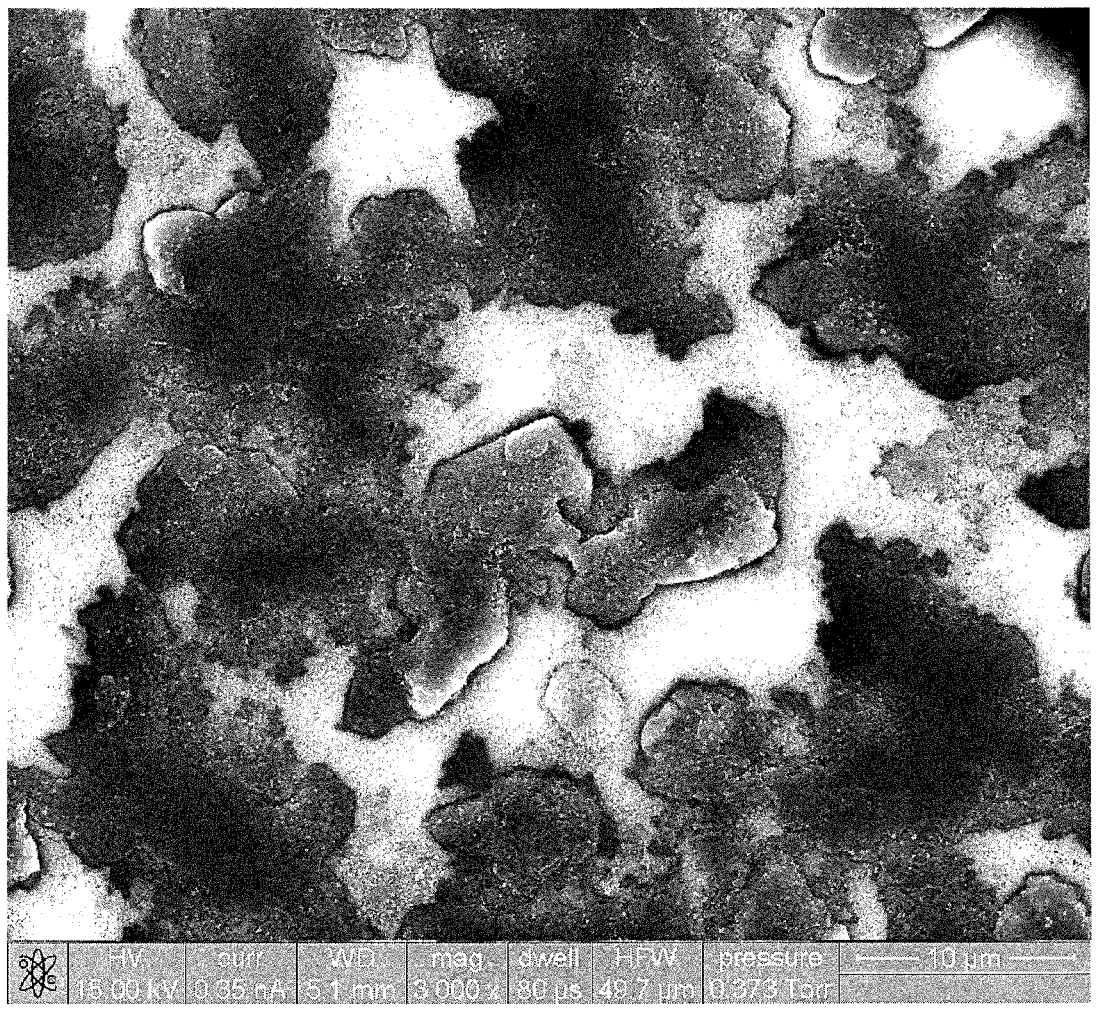

FIG. 3 shows an image of a scanning electron microscopy of silicon thin films deposited on flexible glass for a sample with 100 nm Al/200 nm Si.

Figure 4:
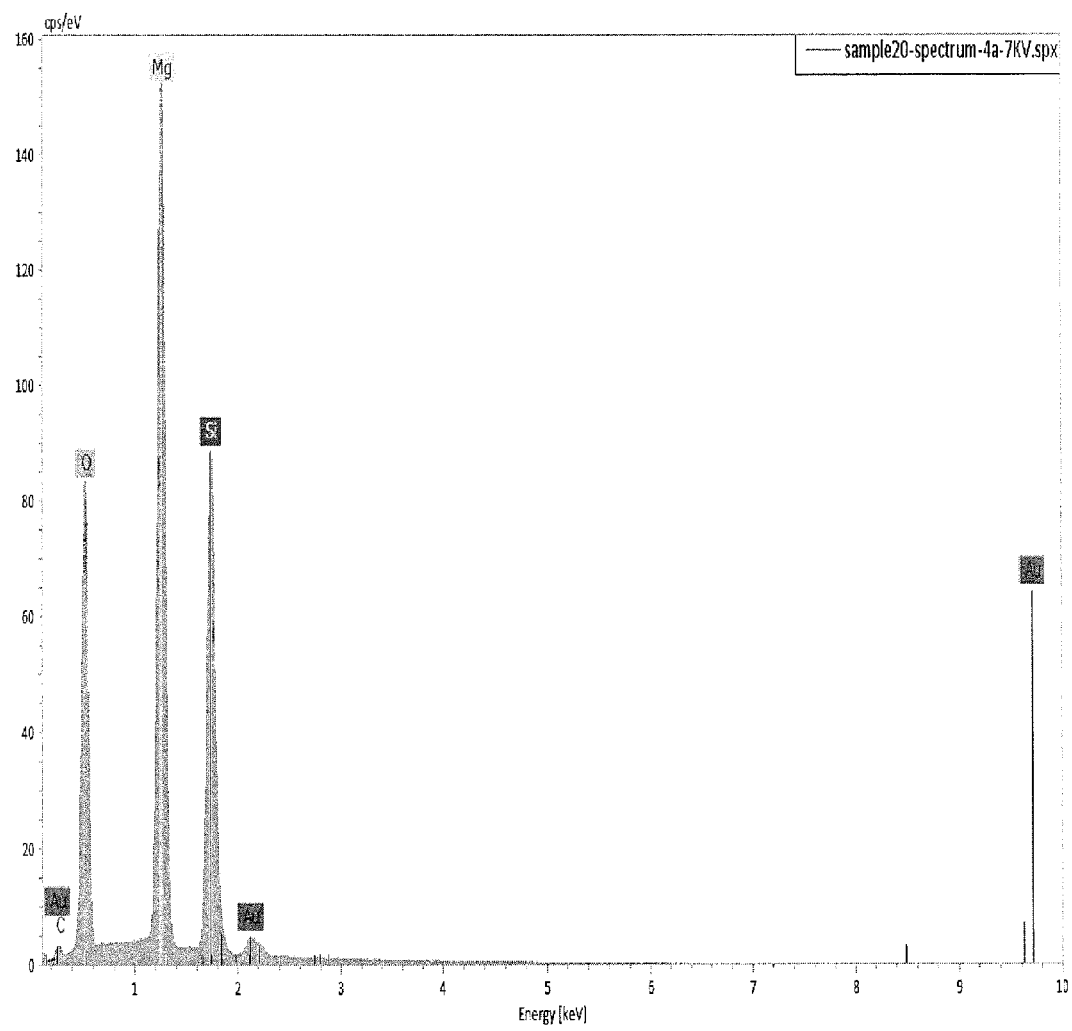

FIG. 4 shows an EDS (Energy-dispersive X-ray Spectroscopy) spectrum of one data point of a silicon film grown using the method disclosed herein. The figure represents a very low amount of Au-contamination within the semiconductor film layer.

Figure 5:
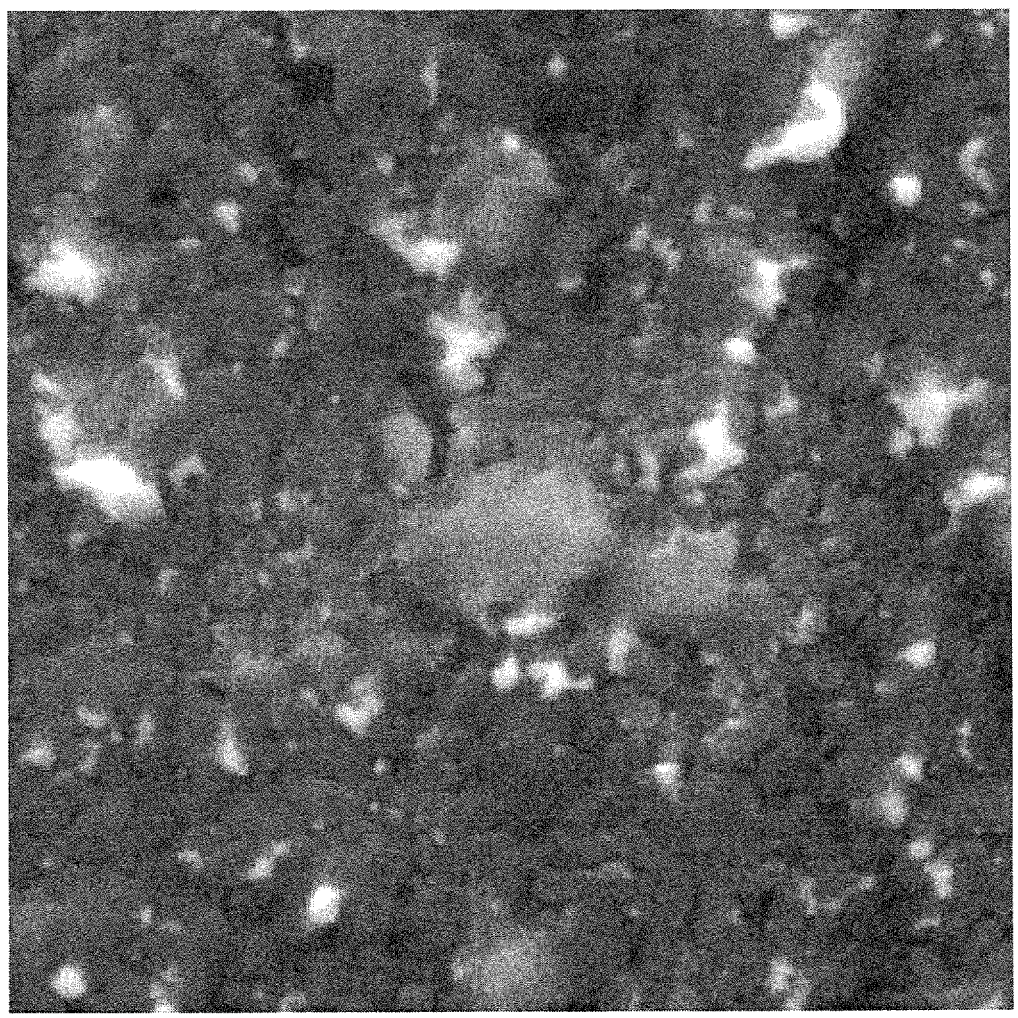

FIG. 5 shows the minor amount of the gold (Au) remnants on top of a silicon film grown using the method of the present invention, after etching.

Figure 6:
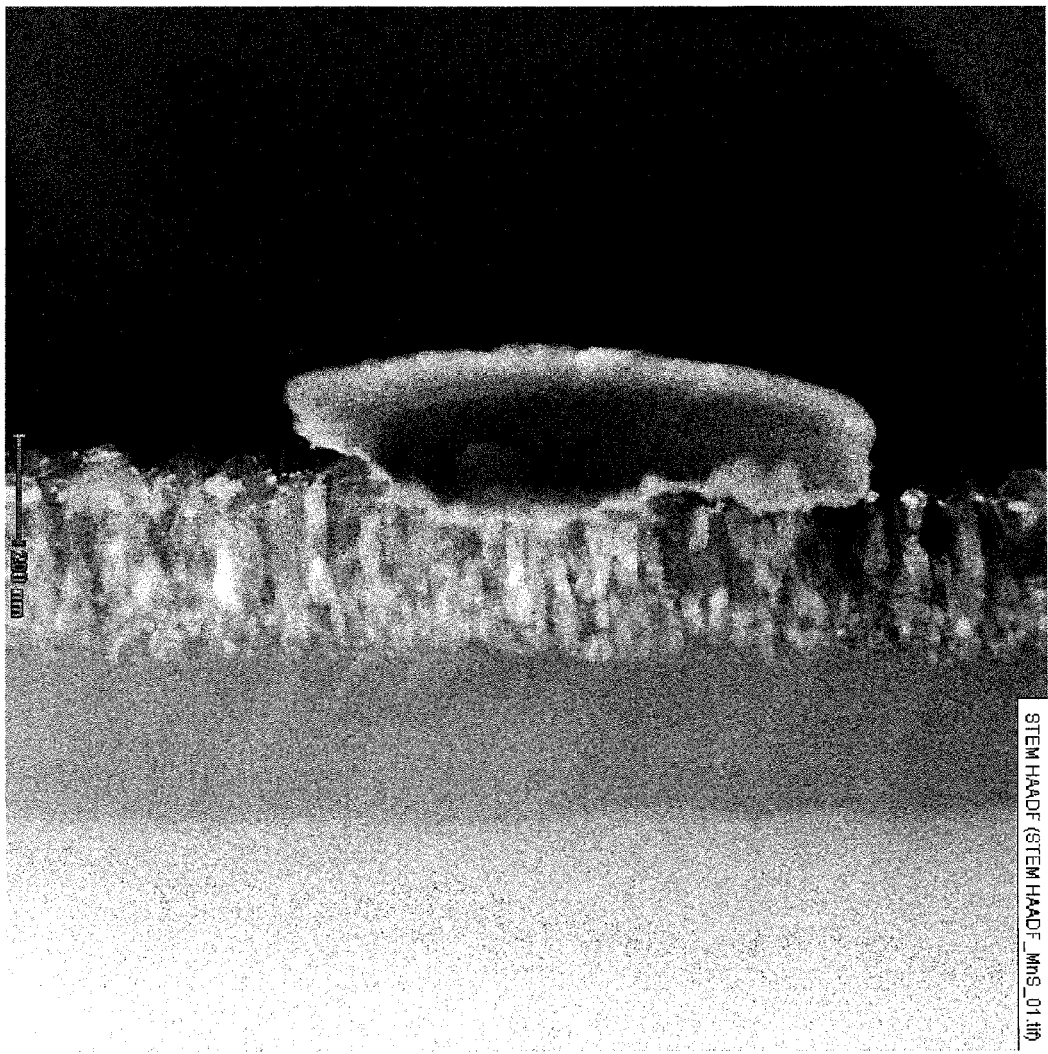

FIG. 6 shows a STEM/HAADF image taken of a semiconductor silicon film produced according to the method described in Example 6, discussed in detail below. The image shows some Au (gold) metal located on top of the silicon layer but no Au (gold) metal within the silicon layer or lattice.

Figure 7:
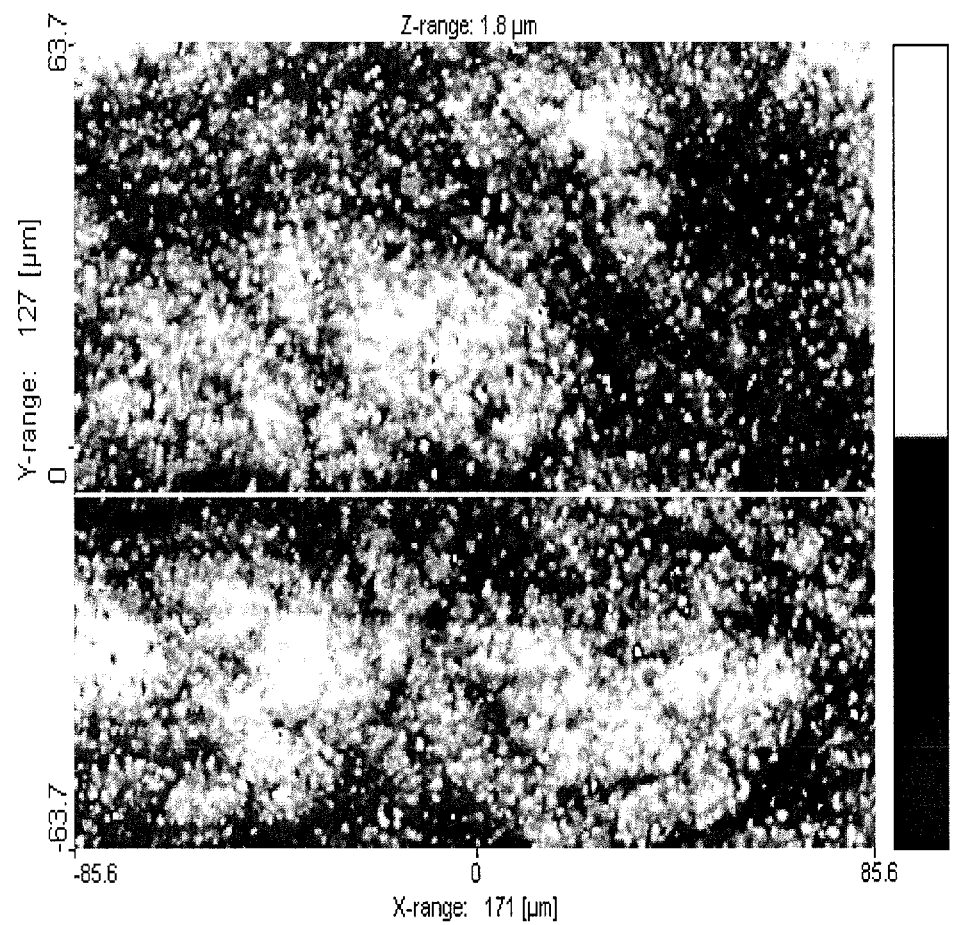

FIG. 7 shows a roughness characterization of the Si—Au crystalline thin-film according to Example 7.

Figure 8:
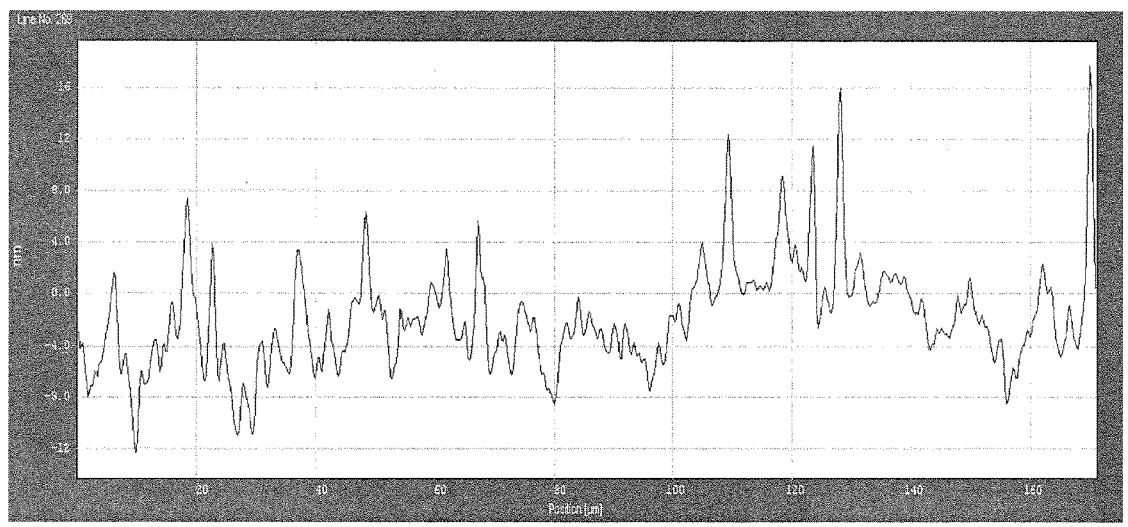

FIG. 8 shows the results of an optical profilometer of Si—Au crystalline thin-film according to Example 7 having an average roughness of 3.4 nm.

Figure 9:
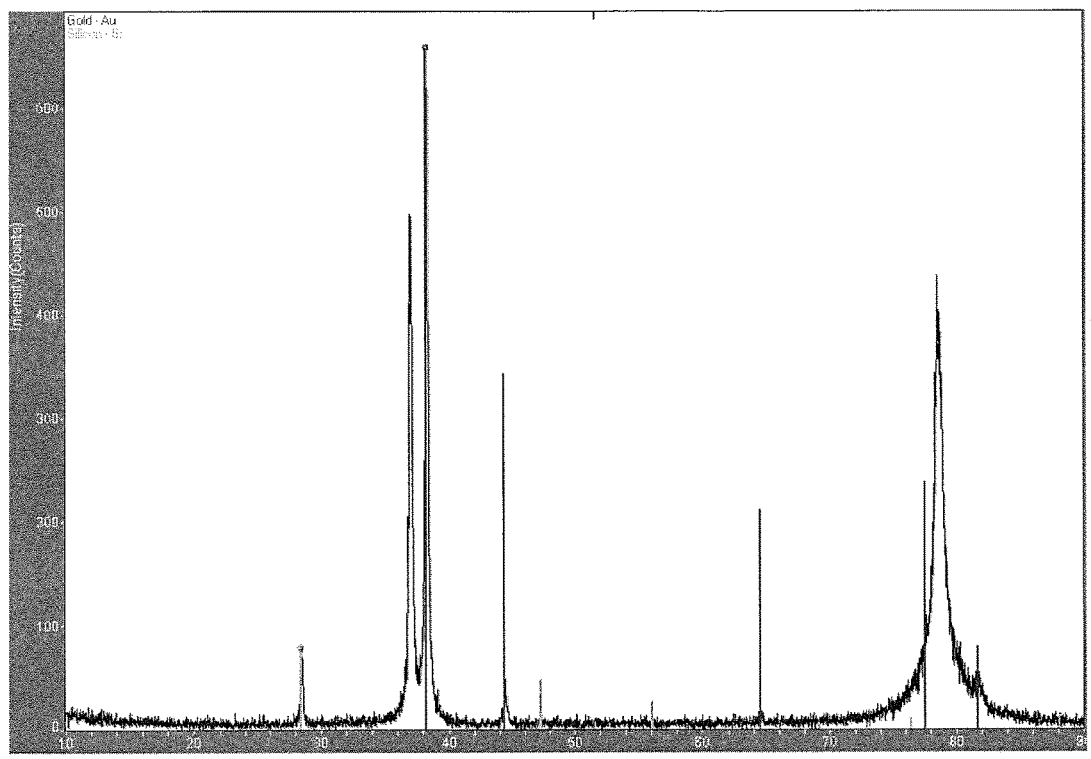

FIG. 9 shows a XRD image showing only one silicon peak.

DETAILED DESCRIPTION OF THE INVENTION

As described above, we have disclosed a method to produce low cost single crystal or large grained epitaxially aligned good quality semiconductor films, in particular silicon, for photovoltaic technology. We have also suggested the use of tapes or glass slabs as substrate materials. The tapes provide strong texture on which buffer layers suitable for silicon growth are present. Our method can produce silicon epitaxy at substantially lower temperatures than those commonly practiced, hence not only minimizing interaction with the surface of the substrate but also enabling the use of glass substrates.

We shall be using the eutectics of silicon with gold and aluminum in describing the details of the invention. It is, however, understood that one skilled in the art can extend the methodology to other semiconductors such as germanium, gallium arsenide, or the cadmium selenide class of photovoltaic materials. Furthermore, other metals may also be used in a similar eutectic relationship and composition with silicon. Such metals include but are not limited to Sn (tin), Ag (silver), Cu (copper), In (Indium), Ni (nickel), and Ga (gallium).

Figure 1:
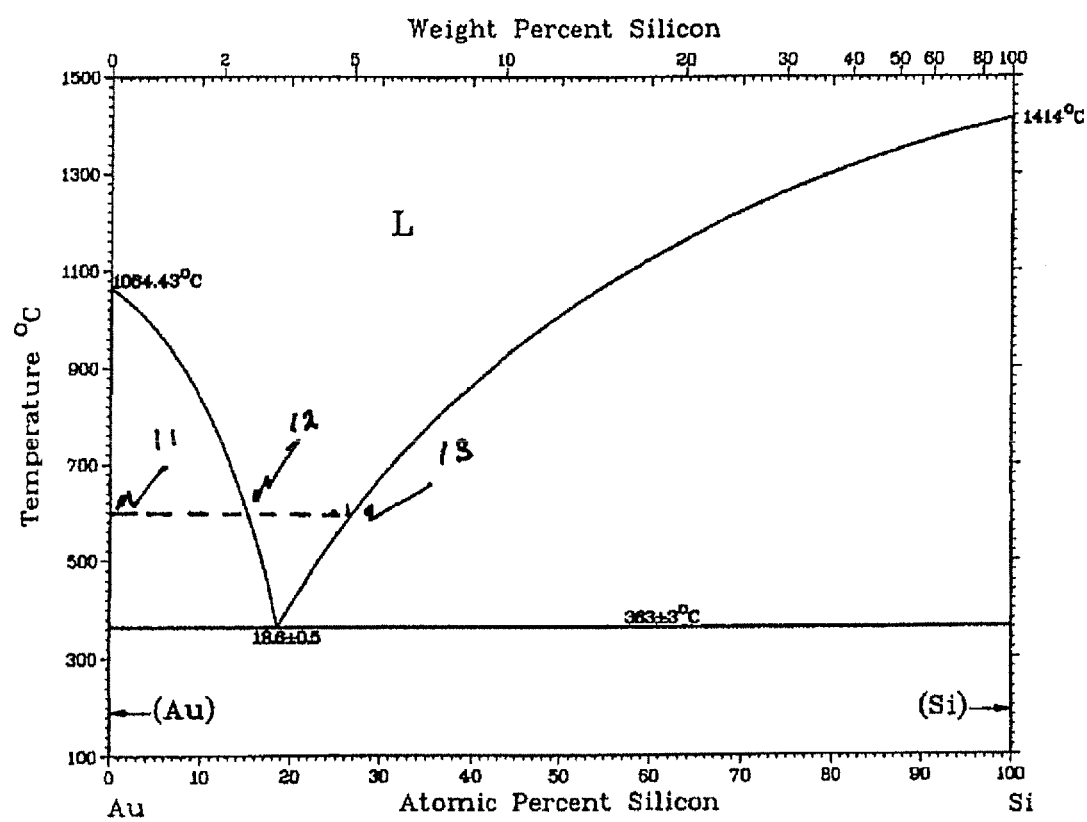
FIG. 1 shows the phase diagram of the eutectic system Au—Si, taken from the literature (Massalski et al). The melting points of the two elements Au and Si, as well as the eutectic temperature are shown in the figure. The eutectic composition is also indicated. The liquidus line, which defines the boundary between the liquid gold-silicon alloy and solid silicon and a gold-silicon liquid alloy, and on the silicon rich side of the phase diagram, is marked. The figure also shows the change in phases as the composition is changed by depositing silicon on a film of gold held at constant temperature. As the silicon is evaporated on to the gold film, the film comprises of gold solid and a liquid gold-silicon alloy which changes from the point marked by 11 towards 12. Further deposition of silicon results in the film entering the liquid phase region between the points marked 12 and 13. As the silicon deposition continues beyond the point 13, the liquidus boundary, solid silicon nucleates from the liquid which is in equilibrium with a silicon-gold liquid alloy. The solid silicon is deposited on a MgO substrate, forming a highly textured and relatively large grained heterogeneously nucleated film. The thickness of the solid silicon film increases till the deposition is stopped. As it cools Si continues to deposit from the melt while the Au—Si liquid solution becomes richer in gold.

FIG. 1 shows the phase diagram of the eutectic system Au—Si. The eutectic composition is nominally 18.6 atomic percent pct Si and the rest being gold. A thin gold film is first deposited on the buffered substrate. This is followed by silicon deposition. As the silicon concentration increases the film first forms a two phase mixture of gold and liquid gold-silicon. The composition of the latter is determined by the choice of the deposition temperature. With further increase of silicon, the liquid phase region, marked 12, is reached and the remaining gold is dissolved. With still further increase of the amount of silicon, the second liquidus phase boundary, marked 13, is reached and subsequent deposition of silicon atoms results in a solid phase of silicon in equilibrium with the silicon-gold liquid. If the substrate surface is suitably chosen, for example MgO crystals, the solid silicon nucleates heterogeneously onto the surface. The choice of the temperature of deposition is determined by balancing two considerations: quality in terms of defects of the epitaxial film; too low a temperature or too rapid a growth rate of the film at that temperature can introduce defects versus too high a temperature when chemical interaction or mechanical integrity of the substrate limit the usefulness of the material.

We have started with vapor deposition of the metallic film and added silicon to it to traverse the phase diagram from point marked 11 in the figure. However, the metallic element and silicon can be co evaporated to reach any concentration between the points marked 12 and 13 in the figure and subsequently silicon added to reach the desired thickness, before cooling to room temperature.

When the desired thickness of the silicon film is obtained, the substrate with the film is cooled to room temperature. Even though the amount of gold required to catalyze a silicon film is small, it can be further reduced by etching the gold away, for example, by using iodine etch, available commercially. This gold can be recycled.

In one embodiment of the present invention, the semiconductor material is deposited on an inexpensive substrate material and the surface of which enables heterogeneous nucleation and growth. In another embodiment of the invention, the semiconductor can be applied directly on glass without any buffer layer added. In this latter case, the same deposition process is used but the materials are deposited directly on glass. For example, a eutectic alloy composed of Al and Si are used to deposit Si on glass. The amount of Al and Si can be varied depending on the desired outcome, as can the temperature. It is noted that when depositing directly on flexible glass, the greater the Al thickness and higher the temperature, the better the Si crystallinity will be. FIG. 2 shows SEM (scanning electron microscopy) of silicon thin films deposited on flexible glass as completed on a sample with 40 nm Al/200 nm Si. FIG. 2 shows sporadic large Si crystallites (a few microns in size) across the surface with granular continuity. The granular film was characterized as smaller Si crystallites mixed with some amorphous Si as confirmed by Raman spectroscopy.

Upon increasing the thickness of the aluminum layer, the large Si crystallites appeared more continuous across the surface, while the surrounding granular film morphed into a higher degree crystalline Si, as illustrated by SEM imaging. This trend continued through the thickest Al tested sample, with the granular film significantly retreating from the enlarged and connected Si crystallites and giving way to a surrounding crystalline Si dominated film, as illustrated in the SEM of the second sample with 100 nm Al/200 nm Si. See FIG. 3.

Therefore, the results demonstrate that the crystallization is dependent on the thickness ratio of Al over Si, with the increased Al content assisting the growth of higher crystallinity of Si thin film.

EXAMPLES OF THE INVENTION

The following non-limiting examples are used as illustrations of the various aspects and features of this invention.

Example 1

A good high vacuum system with two electron beam guns, is used to deposit gold and silicon independently. A glass substrate coated with ion beam assisted deposited MgO film is held at temperatures between 575 and 600° C. These are nominal temperatures. It is understood to one skilled in the art that lower or higher temperatures can also be used depending upon the softening temperature of the glass substrate or the reaction kinetics of either gold or silicon with the metallic tape or its buffer layers when used as substrates. A thin gold film of approximately 10 nm thickness is deposited first. This is followed by a silicon film deposited at a rate of 2 nm per minute on top of the gold film. The ratio of the thickness of the gold and silicon films is chosen such that the final composition ensures that a point, marked 13, in FIG. 1 is reached. This point lies at the boundary between the two phase region of solid Si and a liquid Si—Au mixture. For example, for a 10 nm gold film followed a 100 nm silicon film satisfies this condition. Additional silicon film nucleates heterogeneously on the MgO surface to form the desired thin film. The film can now be cooled to room temperature, where the film now comprises of two phases: gold and a relatively large grained and highly textured film of silicon on MgO.

By relatively large grained it is understood to imply a grain size larger than would have been achieved if a silicon film had been deposited under the same conditions but without Au. In the example discussed above the crystallographic texture is strongly [111]. Instead of an insulating substrate such as MgO, it is possible to choose stable and electrically conducting nitrides, such as TiN.

The gold diffuses to the surface of the silicon film, driven by its lower surface energy relative to the silicon surface. The film is etched in a solution, such as a commercially available iodine based chemical, which removes the gold from the two phases, gold and silicon, leaving behind a silicon film.

This silicon film can now be used as the surface on which a thicker silicon film appropriately doped to form a p-n junction, suitable for applications such as photovoltaics, can be deposited. Alternatively, the thin silicon film can be used for heteroepitaxial deposition of other semiconductors, which might be more efficient converters of sunlight to electricity.

We have used two electron beam guns as an illustrative example. It is understood to one skilled in the art that other methods such as a single gun with multiple hearths, chemical vapor deposition, thermal heating, or sputtering can also be used.

Example 2

A good high vacuum system with two electron beam guns is used to deposit aluminum and silicon independently. A glass substrate or a Ni based substrate coated with a buffer layer of $Al_2O_3$ is held at temperatures between 600 and 615 degree ° C. These are nominal temperatures. It is understood to one skilled in the art that lower or higher temperatures can also be used depending upon the softening temperature of the glass substrate or the reaction kinetics of either aluminum or silicon with the metallic tape or its buffer layers when used a substrates. The eutectic Al—Si is used instead of the Au—Si example above. A thin Al film 6 nm thick is deposited on the $Al_2O_3$ followed by a 100 nm thick silicon deposition, and as described in example 1, above, the two phase region comprising of solid silicon and a liquid Si—Al mixture is reached. The deposition is stopped and the sample is slowly cooled to room temperature. Aluminum diffuses through the silicon film, driven by its lower surface energy relative to silicon. The silicon film is heteroepitaxially aligned by the $Al_2O_3$ surface. The aluminum film on the surface can be etched chemically by well-known processes to leave behind a silicon film. The surface of this film can now be used for further growth of epitaxial films either for photovoltaic devices or for field effect transistors.

We note, as stated earlier, that silicon can be grown epitaxially on sapphire but at temperatures higher than 750° C. This is a well-established commercial process. However, in the absence of aluminum, silicon deposition at, say, 600° C. produces a fine grained film rather than a heteroepitaxial film, as described above.

Example 3

We describe in this example how different methods of deposition can be combined to take advantage of highly textured films as described in example 1, above. The Si film produced from the deposition of example 1 is etched to remove the Au and then placed back into the vacuum chamber and $p^+$-Si is deposited on this film. This latter layer serves two purposes: it provides a conducting layer for a photovoltaic device to be subsequently built on it and can be the starting point for a variety of differently configured photovoltaic devices as, for example, a nanowire photovoltaic device. Here a 2-3 nm thick gold film is deposited on the silicon using an electron gun. This 2-3 nm thick gold film breaks up into nanoparticles and is the starting point used by a number of investigators to use chemical vapor deposition to grow nanowires and use these nanowires for photovoltaic devices. The difference is that we show how an inexpensive buffered glass can be used rather than a relatively expensive single crystal Si substrate.

A second possibility is to deposit a Au film of thickness 5 nm as islands on a MgO buffered glass substrate, using lithographic or other means known in the art. A heavily doped silicon ($p^+$ or $n^-$) film is now deposited on the surface followed by a p- or n-type silicon using electron beam deposition, as described in example 1. The thickness of the heavily doped film is in the micron range whereas the lightly doped film is of the order of 100 nm. The deposition process is now changed and chemical vapor deposition is used for subsequent deposition of suitably doped films of silicon, practiced in the art to grow silicon nanowire photovoltaic devices. The heavier doped silicon film serves the purpose of a conducting layer. Using gold islands has the advantage of controlling the nanowires diameter and length in order to maximize the efficiency of the photovoltaic cell (Kayes et al). Instead of using the insulating MgO buffer layer, a conducting material such as TiN can be used.

Example 4

We describe how different methods of deposition and temperature can be combined to take advantage of films grown as described in Examples 1 and 2, above to produce desirable device structures. Instead of depositing the Al and Si films described in Example 2 above, by two electron beam heated sources in a vacuum, we deposit the Si by decomposition of silane using a chemical vapor deposition chamber. This is a well known industrial process. As in Example 2, we deposit a 6 nm thin film of Al on to a sapphire substrate held at 600° C. We then introduce silane gas into the chamber. At these temperatures, the silane decomposes to form a Si film which reacts with the Al to produce a eutectic solution and when this solution is saturated with Si (the equivalent of point marked 13 in FIG. 1 for an Au—Si alloy) the Si precipitates to heterogeneously nucleate to form an epitaxial film on the surface of the sapphire substrate. This film is continuous and can be doped by adding borane or phosphene gases to silane to obtain p or n type semiconductor behavior. This film can now be used as a basis to construct thin film photovoltaic cells or, alternatively, grow nanowires of Si on top of it by simply lowering the temperature of the substrate below the eutectic temperature of Al-Si (577° C.). For example, if the temperature of deposition is 500° C., Si nanowires will grow on top of the Si film. The Al particles that precipitate out of the Al-Si solution once the temperature of the substrates is below the eutectic temperature now catalytically reduce the silane gas to form nanowires, as described in the literature. These nanowires can be used to build electronic devices, including photovoltaic cells.

Example 5

The same process can be performed as in the above examples, but directly on glass rather than on a buffered substrate.

A textured silicon seed layer on a glass substrate was grown from an Al—Si eutectic melt layer at 725° C. via e-beam evaporation technique. A smooth, thin, and flexible glass with a relatively elevated glass transition temperature was used as the substrate material for this investigation. Prior to film deposition, the glass substrates were cleaned by the standard RCA procedure and dipped in a 2% HF-solution for 30 seconds (GORKA). Aluminum pellets (99.999% in purity, Kurt J. Lesker) and silicon pellets (99.999% in purity, Kurt J. Lesker) were used as the thermal evaporator and e-beam evaporator material sources, respectively. Using a thermal evaporator, Al layers varying from 30 to 100 nm in thickness were deposited onto glass substrates under moderate vacuum conditions of 10-5 Torr. The sample was removed from the thermal evaporator, placed into the electron beam evaporator and taken to base vacuum levels of 10-7 Torr. A Si film of 200 nm thick was subsequently deposited onto the Al base layer while the substrate was held at 725° C. The deposition rate of Si was held constant at 6 nm/min. After the deposition was completed, the samples were allowed to naturally cool down to room temperature. No post-deposition film annealing was required. XRD spectra revealed that a crystalline Si film has successfully been grown on the glass substrate with no buffer layer or post-processing annealing step and given that there is a relatively intense Si [111] peak, the film can be characterized as textured. Further work would include optimization of the growth parameters towards the achievement of complete continuity of a crystalline silicon seed layer atop the glass substrate followed by deposition of a thicker semiconductor film for devices of various kinds.

Example 6

The following example describes an exemplary method for producing contamination-free semiconductor ("contamination-free," as used herein, is defined as no observable metal in the crystal lattice of the silicon film, as shown via figures of STEM imaging and EDS herein) and metal layers, such that a semiconductor film produced has very few, if any, metal impurities therein. The metal film similarly has very few semiconductor impurities after the process exemplified is complete. Such a contamination-free semiconductor film is entirely free of metal impurities, or at least substantially free of metal impurities such that it greatly lowers, and in some cases removes entirely, the potential of the semiconductor film to induce highly active recombination defects near mid-gap due to such metal impurities located within the film. Contamination-free semiconductor film is a further improvement upon defect-free semiconductor film because there are no impurities within the semiconductor film, no impurities within the metal film, and no recombination defects.

The following is an example of the method for producing contamination-free semiconductor films using silicon and gold as the semiconductor and metal, respectively. However, other semiconductor materials such as germanium and other metals such as tin can also be used.

A good high vacuum system with two electron beam guns was used to deposit gold and silicon independently and directly on a single crystal MgO [111] wafer substrate. The substrate was held at a temperature between 575° C. and 600° C. during deposition. A thin gold film of approximately 10 nm was deposited on the substrate first. This was followed by a silicon film deposited at a rate of 2 nm per minute on top of the gold film. The film was then cooled to room temperature, allowing the phases of the film to separate into gold and a crystalline film of silicon on the glass. Importantly, there was no annealing step.

Impurities in silicon influence solar-cell properties in a variety of ways. For example, crystal growth can be perturbed resulting in defects, inclusions, precipitates, or polycrystalline structure, thus causing substantial detrimental effects during application and employment of the crystal. The bulk properties of the silicon may be altered by electrically active impurity centers which reduce the minority carrier diffusion length either by increased combination near midgap or by scattering-induced mobility loss. Additionally, impurities may induce contact and contact interface degradation, series and shunt resistance effects, as well as precipitation and other junction defect mechanisms. (Davis et al "Impurities in Silicon Solar Cells", IEEE 1980). Cell efficiency, particularly in high efficiency devices, is strongly degraded by metal contaminants which reduce bulk diffusion length. For example, as few as $10^{11}$ Ti atoms cm$^{-3}$ can reduce the efficiency of an 18.5% cell to 16.8%. (R. H. Hopkins et al "Impurity effects in Si for solar cells", Journal of Crystal Growth, 1986).

It is known that one atomic percent Au in a cubic centimeter (cm$^3$) of Si corresponds to $5 \times 10^{20}$ Au atoms. This is a very heavy doping level and could be considered almost alloy. Typical doping levels in semiconductors range from $10^{16}$ to $10^{19}$; the higher level being a degenerate semiconductor. Deep level traps of 1% or less of the doping level are not a problem for Si. But 1 atomic % is much higher. The silicon films grown here with Au have less than 0.1 atomic % based on the results from performing Energy-dispersive X-ray spectroscopy (EDS) of the semiconductor film produced using the method of this example. It should be noted that similar films may be produced using Sn (tin), Ag (silver), Cu (copper), In (Indium), Ni (nickel), or Ga (gallium) in a manner similar to that which is described herein for Au (gold). Four data points were taken at 10 KV, and one data point at 7 KV. Both results show a concentration of Au (metal) below 0.1 atomic % within the Si (semiconductor) layer. Since this is a thin-film, spectra at 5 different voltages on the sample were taken giving the composition and film thickness as well. FIG. 4 illustrates the EDS spectrum of just one data point (7 KV) and shows a concentration of Au up to 1.6 atomic %, most likely due to scattering from Au remnants on top of the film after etching, which can be seen in FIG. 5. The extremely low Au atomic percentage in the Si film means that any leftover traces (below the 0.1 atomic %) of Au in the film are so low that the Au cannot and will not induce highly recombination active defects near mid-gap (i.e., the Au does not cause substantial detrimental effects). It is noted that other samples of the semiconductor film produced by the present method show leftover traces of Au (and other metals) as low as, and lower than, 0.01 atomic percent, 0.001 atomic percent, 0.0001 atomic percent, 0.00001 atomic percent, 0.000001 atomic percent, 0.0000001 atomic percent, 0.00000001 atomic percent, and 0.000000001 atomic percent metal. It is generally understood that 5N or 6N is often the number cited for silicon purity requirements for solar technology, where N represents the number of 9's with regard to the purity of the silicon. For example, 5N corresponds to 99.999% pure silicon (and thus 0.0001 atomic percent metal, or other contaminants or impurities). Therefore, at a minimum, a single impurity must have a concentration less than 1 ppm, since there are often many different kinds of impurities within the silicon. Additionally, they should all cumulatively be less than 0.0001 atomic percent, if one wishes to remain in the 5N purity window. The integrated circuits industry, in contrast, demands 9N pure silicon.

It is also noted that the extremely low Au atomic percentage in the Si film produced according to the present invention means that the Au is substantially entirely recoverable (98 to 100% recoverable), meaning that the cost of manufacture is not affected by using Au, thus allowing for affordable scalability of the processes disclosed herein.

A STEM/HAADF (high angle annular dark field (HAADF) scanning transmission electron microscopy (STEM)) imaging system was used to evaluate and validate the results of the film produced according to the above-described method. It is generally known that STEM/HAADF offers significant benefits in dark field operation with a unique imaging mode, High Angle Annular Dark Field (HAADF) imaging. For example, the inner angle of the annular darkfield detector may be made so large (30 milliradians) that no Bragg diffracted electrons are collected. The images therefore come from elastically scattered electrons which have passed very close to the atomic nuclei in the sample. High (single atom column) resolution is possible with no unwanted diffraction contrast which can mask structural information. The HAADF signal is directly proportional to the density and thickness of the specimen and proportional to $Z^{3/2}$ where Z is the atomic number. Thus it is possible to produce images which show contrast due to the mass-thickness (i.e. where the signal is proportional to the number of atoms), or Z contrast images (i.e. where the signal is proportional to the atomic number of the sample). HAADF is suitable for inorganic and organic samples and for crystalline and amorphous materials. An additional bonus offered by the STEM is the ability to collect secondary electrons and backscattered images in the same way as a standard SEM. This makes it possible to correlate surface information (from secondary electrons) with bulk information from the STEM mode. It is also possible to use the secondary electron mode to image samples which are too thick even for STEM observation. The high accelerating voltages available in the STEM offer ultra-high resolution compared to a conventional SEM.

With regard to this particular example, STEM/HAADF images were taken of the semiconductor film prepared using the method of the present invention (see, for example, FIG. 6). These images show no signs of metal (e.g., Au) in the silicon film. Thus, the purity of the silicon film is at least 5N and such that any impurity, including but not limited to Au, within the highly textured semiconductor film causes no substantial detrimental effect in the semiconductor silicon film. STEM/HAADF imaging is known to those of ordinary skill in the art to be a strong measure for determining Au (and other metal) impurity levels in semiconductor films, as discussed above. STEM images are directly interpretable, and the STEM lattice images would show Au as being greater than the Si, if Au were in fact located within the silicon layer or interface.

Example 7

The following example describes an exemplary method for making smooth crystalline semiconductor thin-films and hole and electron transport films for solar cells and other electronic devices. Such semiconductor films have an average roughness of 3.4 nm thus allowing for effective deposition of additional semiconductor film layers such as perovskites for tandem solar cell structures which require extremely smooth surfaces for high quality device fabrication.

Many electronic devices today are comprised of thin-films. Such films are typically deposited on a substrate such as glass, or a buffer layer, or even another semiconductor layer in the case of a tandem solar cell or a light emitting diode (LED). A monolithic tandem solar cell has two layers, one deposited directly on another. For the cell to function efficiently, the top layer should preferably be deposited on a smooth bottom layer. An example of such a cell is a perovskite/silicon thin film tandem. The main issues for practical device fabrication of perovskite solar cells are film quality and thickness. The light-harvesting (active) perovskite layer needs to be several hundred nanometers thick—several times more than for standard organic photovoltaics. Unless the deposition conditions and annealing temperature are optimized, rough surfaces with incomplete coverage will form. Even with good optimization, there will still be a significant surface roughness remaining. Therefore, thicker interface layers than might normally be used are also required. When depositing perovskite films (by spin coating, for example) on a bottom layer such as silicon, the bottom layer must be smooth or the perovskite film will be shunted and therefore will have to be thicker in order to overcome the negative effect of the roughness of the surface of the bottom layer. An increase in thickness not only is more costly, but lowers the optical transmission, which in turn affects the overall device performance negatively. A thin perovskite film is therefore preferable, but requires a very smooth surface which is an involved task in the prior art. A simpler, more effective method of fabricating smooth silicon thin films is therefore desirable.

In addition to the bottom layer being preferably smooth, the top layer should also be smooth because when solar cells or other devices are fabricated a conducting layer is deposited on the top layer for either hole transport or electron transport. Such ultrathin films called HTLs or ESLs require or benefit from a very smooth surface on which to be deposited.

A simple and cost effective method for producing smooth thin films on substrates is disclosed in the previous examples, and described again in the following example which is just one embodiment of a simple and cost effective method for producing smooth thin films on substrates. These substrates can include sapphire, buffered glass (MgO, Al2O3, TiN, and ZrN, for example), and other inexpensive substrates. The example uses silicon and gold, but the process can be extended to other materials such as germanium, copper and tin, for example.

A good high vacuum system with two electron beam guns was used to deposit gold and silicon independently and directly on a single crystal MgO [111] wafer substrate. The deposition of the gold and silicon is continuous along the substrate. The substrate was held at a temperature between 575° C. and 600° C. during deposition, the deposition temperature range used for the thin gold film and silicon may be the same. A thin gold film of approximately 10 nm was deposited on the substrate first. This was followed by a silicon film deposited at a rate of 2 nm per minute on top of the gold film. The film was then cooled to room temperature, allowing the phases of the film to separate into gold which rises to the top and a smooth textured film of silicon contacting the MgO wafer.

For device fabrication of solar cells, the gold can be etched, and either an additional semiconductor film is deposited on top of the silicon film for a tandem solar cell, or a hole transport layer (HTL) or electron transport layer (ETL) is deposited on the silicon film and followed by a contact layer on top consisting of Ag or Au. The additional semiconductor film, HTL and ETL can all be deposited with smoothness, replicating the layer it is deposited on since the underlying silicon film is smooth.

In the present example silicon was used, but any inorganic film can be used, as can a variety of metals, such Sn, or Ni, which form a eutectic with inorganic materials.

FIG. 7 shows the roughness characterization of the Si—Au crystalline thin-film sample on a MgO wafer of example 7. FIG. 8 shows the result of an optical profilometer of the Si—Au crystalline thin-film according to Example 7 having an average roughness of 3.4 nm. Using an optical profilometer, an average roughness of the Si—Au film on the MgO [111] wafer substrate was measured at 3.4 nm which is very smooth and sufficient for perovskite film deposition, for example. A line-scan across the sample showing heights in a single profile was also performed. The scan area was quite large, about 250 µm². Also, the RMS data shows double the average height, approximately 7.5 nm. FIG. 9 shows an XRD image which shows only one silicon peak of Example 7, indicating a textured silicon film was grown on the MgO substrate.

In the present invention, the terms 'textured', 'large grain', and 'smooth' are defined by the following definitions. The term 'textured' means that the crystals in the film have preferential orientation either out-of-plane or in-plane or both. For example, in the present invention the films can be highly oriented out-of-plane, along the c-axis. The term 'large grain' is defined as a grain size larger than would have been achieved if a silicon (or other inorganic material) film had been deposited under the same conditions but without metals, i.e. Au. More specifically, the term 'large grain' is defined as the grain size is comparable to or larger than the carrier diffusion length such that electron-hole recombination at grain boundaries is negligible. In semiconductor films this means that the grain size is greater than or equal to the film thickness. Finally, the term 'smooth' is defined as a film, the semiconductor film for example, has an average roughness of less than 10 nm, and an RMS of less than 20 nm.

The present invention greatly enhances device efficiency and effectiveness.

While the principles of the invention have been described in connection with specific embodiments, it should be understood clearly that the descriptions, along with the examples, are made by way of example and are not intended to limit the scope of this invention in any manner. For example, a variety of suitable substrates different from the examples given above can be utilized or a different variety of deposition methods and conditions can be employed as would be understood from this invention by one skilled in the art upon reading this document.

The invention claimed is:

1. A method of growing a semiconductor film, comprising the steps of:
   providing a substrate;
   depositing a continuous metal thin-film on said substrate;
   depositing a semiconductor film onto said continuous metal thin-film at a constant deposition temperature, said semiconductor film and said metal thin film forming a eutectic liquid, said constant deposition temperature being between a eutectic temperature of said eutectic liquid and below a softening temperature of said substrate, and at said constant temperature, increasing a concentration of said semiconductor such that the eutectic liquid becomes saturated with said semiconductor and said semiconductor nucleates from said eutectic liquid;
   cooling said eutectic liquid to room temperature at which said eutectic liquid solidifies and said metal thin film and said semiconductor film separate, wherein said metal thin film rises above said semiconductor film and said semiconductor film contacts said substrate; and
   forming a textured semiconductor film on said substrate wherein said textured semiconductor film replicates a texture of said substrate, said textured semiconductor film having an average roughness of less than 10 nm, and RMS of less than 20 nm.

2. The method of claim 1, wherein said semiconductor film is inorganic.

3. The method of claim 1, wherein said metal is one of Sn, Al, Ag, Ni, Au and Cu.

4. The method of claim 1, further comprising: adding an additional semiconductor film, a hole transport layer or an electron transport layer on top of said semiconductor film; and depositing a contact layer on top of said hole transport layer or said electron transport layer to fabricate a solar cell device.

5. The method of claim 1, wherein said average roughness is 3.4 nm, and the RMS is 7.5 nm.

6. The method of claim 1, wherein an additional thin film is deposited on said semiconductor film, said additional thin film having an average roughness of less than 10 nm and a RMS less than 20 nm.

7. The method of claim 6, wherein said additional thin film is a semiconductor.

8. The method of claim 6, wherein said additional thin film is a hole transport layer (HTL).

9. The method of claim 6, wherein said additional thin film is an electron transport layer (ETL).

10. The method of claim 1, wherein said method achieves a semiconductor film having a purity of 5N or greater.

* * * * *